United States Patent
Okuda

(10) Patent No.: US 7,148,864 B2
(45) Date of Patent: Dec. 12, 2006

(54) DISPLAY PANEL AND DISPLAY DEVICE

(75) Inventor: Yoshiyuki Okuda, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 256 days.

(21) Appl. No.: 10/446,139

(22) Filed: May 28, 2003

(65) Prior Publication Data

US 2004/0012336 A1  Jan. 22, 2004

(30) Foreign Application Priority Data

May 29, 2002  (JP) .............................. 2002-155694

(51) Int. Cl.
*G09G 3/30* (2006.01)
(52) U.S. Cl. ......................................... 345/76; 345/82
(58) Field of Classification Search ............. 345/60–82
See application file for complete search history.

(56) References Cited

U.S. PATENT DOCUMENTS

| 4,349,816 | A | * | 9/1982 | Miller et al. .................. 345/76 |
| 4,755,807 | A | * | 7/1988 | Guennou ..................... 345/83 |
| 5,982,345 | A | * | 11/1999 | Takayama et al. ............ 345/76 |
| 6,351,255 | B1 | * | 2/2002 | Ishizuka et al. .............. 345/77 |
| 6,376,994 | B1 | * | 4/2002 | Ochi et al. ................... 345/101 |
| 6,900,785 | B1 | * | 5/2005 | Kimura ....................... 345/76 |

FOREIGN PATENT DOCUMENTS

JP  2003-59649  2/2003

* cited by examiner

Primary Examiner—Bipin Shalwala
Assistant Examiner—David L. Lewis
(74) Attorney, Agent, or Firm—Sughrue Mion, PLLC

(57) ABSTRACT

A display panel which comprises m driving lines, n scanning lines which intersect with the m driving lines, pixel portions each including two organic electroluminescence elements connected with each other in parallel with inverse polarity, which are connected to a driving line and a scanning line at each intersection, m first capacitive elements provided on the respective driving lines, and n second capacitive elements each of which is provided so as to correspond to one of the scanning lines, and a display device using the display panel.

8 Claims, 4 Drawing Sheets

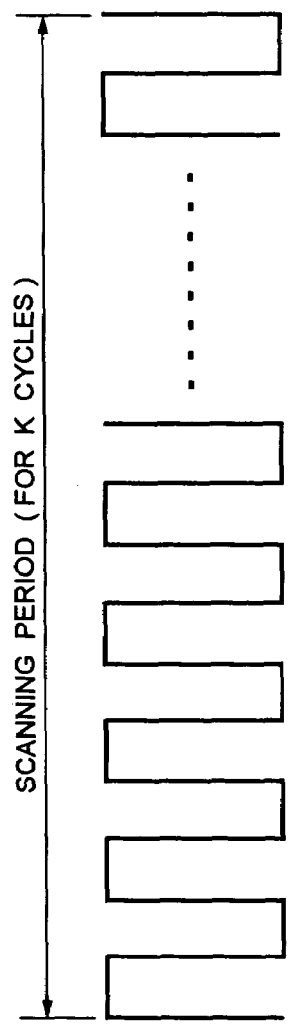
FIG. 5A  SCAN ALTERNATING CURRENT SIGNAL
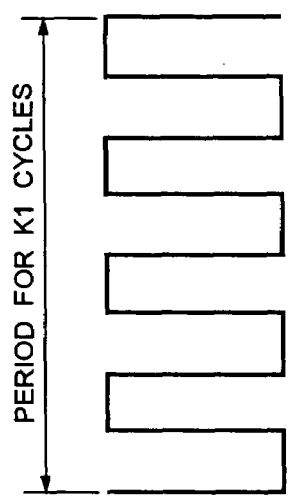
FIG. 5B  DRIVE ALTERNATING CURRENT SIGNAL
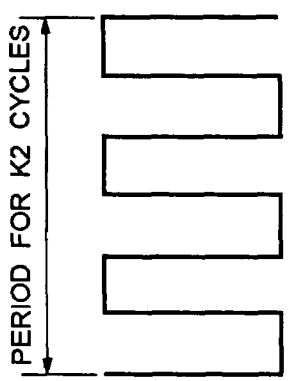
FIG. 5C  DRIVE ALTERNATING CURRENT SIGNAL

DISPLAY PANEL AND DISPLAY DEVICE

BACKGROUND OF THE INVENTION

1. Field of the Invention

The present invention relates to a display panel using organic electroluminescence elements and a display device in which the display panel is included.

2. Description of the Related Background Art

A display device used for a movable terminal such as a cellular phone requires a thin display panel. Although a liquid crystal display panel is usually used for the conventional thin display panel, since a display panel formed by a plurality of organic electroluminescence elements (organic EL elements) in a matrix shape is not only thin but also light, it is regarded useful as a display for the movable terminal.

In the conventional display panel of a matrix shape using the organic electroluminescence elements, a lot of organic electroluminescence elements are generally provided on a transparent substrate such as a glass and a plastic film, and in order to protect these elements from the surrounding environment such as humidity and dust, these elements are insulated on a transparent substrate by an insulation seal film such as silicon dioxide film. Therefore, in order to connect an organic EL element to a driving circuit, it is necessary to draw the electrodes directly from the organic EL element on a panel and extend this to a driving circuit outside of the display panel through the outer peripheral portion of the insulation seal film.

In the conventional display panel, adopted is the structure of forming a connection pattern by drawing a connecting electrode from the insulation seal film once and electrically connecting with the external connection pattern for power supply through an anisotropy conductive film such as Anisolm.

In this structure, however, since thermo-compression processing in forming an electric insulation by an anisotropy conductive film is required, it is defective in that the manufacturing process of display panels becomes complicated. Further, peeling of the anisotropy conductive film easily occurs in this structure, and when the anisotropy conductive film is once peeled off, it is difficult to adhere it there again.

Further, since draw of electrodes is performed from an organic EL element in the peripheral portion of a display panel, each connection of electrodes becomes difficult in the central portion on a luminescent surface. Therefore, when the electrodes are drawn from all the organic EL elements forming a display panel, a dead space occurs in the peripheral portion of the display panel, which makes the whole area of the display panel enlarge. Further, the drawing portions of the electrodes are more fragile than the other sealing portion from the viewpoint of water intrusion, which causes deterioration of the internal elements.

SUMMARY OF THE INVENTION

An object of the present invention is to provide a matrix-shaped display panel which is capable of supplying power from a driving circuit to organic EL elements in a simple structure and a display device using the display panel.

A display panel according to the invention comprises: m (m is an integer which is equal to or greater than two) driving lines which are disposed mutually in parallel; n (n is an integer which is equal to or greater than two) scanning lines which are disposed mutually in parallel so as to intersect with the m driving lines; a plurality of pixel portions each of which includes two organic electroluminescence elements which are connected with each other in parallel with inverse polarity, and which are connected to one of the m driving lines and one of the n scanning lines at an intersection thereof; m first capacitive elements each of which is provided so as to correspond to one of the driving lines, and has one end connected with the corresponding driving line; and n second capacitive elements each of which is provided so as to correspond to one of the scanning lines, and has one end connected with the corresponding scanning line.

A display panel according to the invention comprises: m (m is an integer which is equal to or greater than two) driving lines which are disposed mutually in parallel; n (n is an integer which is equal to or greater than two) scanning lines which are disposed mutually in parallel so as to intersect with the m driving lines; a plurality of pixel portions each of which includes an organic electroluminescence element and a diode element which are connected with each other in parallel with inverse polarity, and which are connected to one of the m driving lines and one of the n scanning lines at an intersection thereof; m first capacitive elements each of which is provided so as to correspond to one of the driving lines, and has one end connected with the corresponding driving line; and n second capacitive elements each of which is provided so as to correspond to one of the scanning lines, and has one end connected with the corresponding scanning line.

A display device according to the invention comprises: a display panel including m (m is an integer which is equal to or greater than two) driving lines which are disposed mutually in parallel, n (n is an integer which is equal to or greater than two) scanning lines which are disposed mutually in parallel so as to intersect with the m driving lines, a plurality of pixel portions each of which includes two organic electroluminescence elements which are connected with each other in parallel with inverse polarity, and which are connected to one of the m driving lines and one of the n scanning lines at an intersection thereof, m first capacitive elements each of which is provided so as to correspond to one of the driving lines, and has one end connected with the corresponding driving line, and n second capacitive elements each of which is provided so as to correspond to one of the scanning lines, and has one end connected with the corresponding scanning line; a controller which specifies one of the n scanning lines in a predetermined order and every time of specifying the one scanning line, specifies at least one pixel portion driven to emit light of the pixel portions positioned on the one scanning line; a driving line circuit which supplies a drive alternating current signal to the other end of the first capacitive element of which the one end is connected to the driving line corresponding to the at least one pixel portion specified by the controller; and a scanning line circuit which supplies a scan alternating current signal of an inverse phase to the drive alternating current signal to the other end of the second capacitive element of which the one end is connected to the one scanning line specified by the controller.

A display device according to the invention comprises: a display panel including m (m is an integer which is equal to or greater than two) driving lines which are disposed mutually in parallel, n (n is an integer which is equal to or greater than two) scanning lines which are disposed mutually in parallel so as to intersect with the m driving lines, a plurality of pixel portions each of which includes an organic electroluminescence element and a diode element which are connected with each other in parallel with inverse polarity, and which are connected to one of the m driving lines and one of the n scanning lines at an intersection thereof, m first capacitive elements each of which is provided so as to correspond to one of the driving lines, and has one end connected with the corresponding driving line; and n second capacitive elements each of which is provided so as to correspond to one of the scanning lines, and has one end connected with the corresponding scanning line; a controller which specifies one of the n scanning lines in a predetermined order and every time of specifying the one scanning line, specifies at least one pixel portion driven to emit light of the pixel portions positioned on the one scanning line; a driving line circuit which supplies a drive alternating current signal to the other end of the first capacitive element of which the one end is connected to the driving line corresponding to the at least one pixel portion specified by the controller; and a scanning line circuit which supplies a scan alternating current signal of an inverse phase to the drive alternating current signal to the other end of the second capacitive element of which the one end is connected to the one scanning line specified by the controller.

BRIEF DESCRIPTION OF THE DRAWINGS

FIGS. 5A to 5C each is a view showing a method for controlling luminance of the display device.

DETAILED DESCRIPTION OF THE INVENTION

Hereinafter, embodiments of the invention will be described in detail with reference to the drawings.

Figure 1:
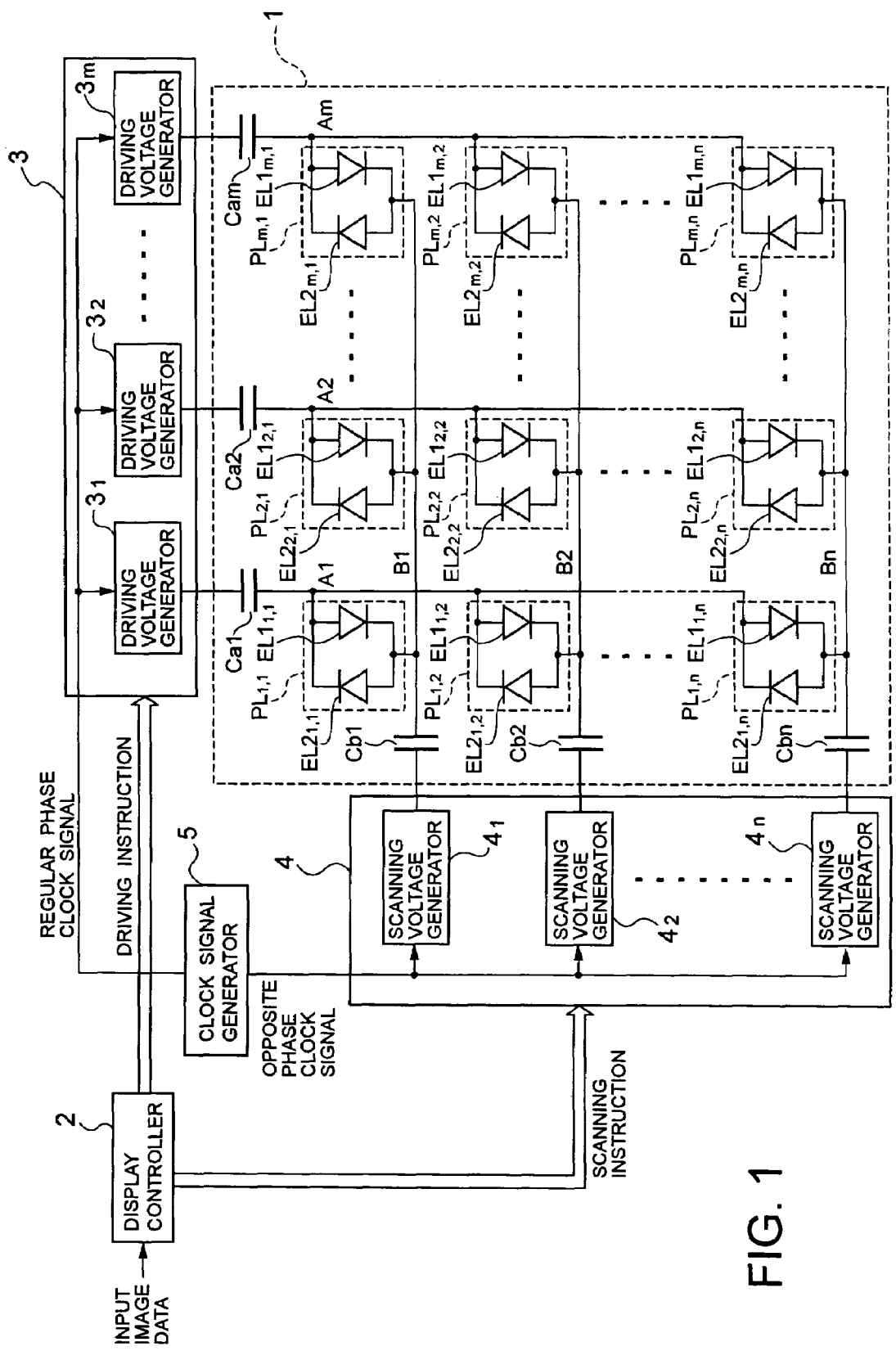
FIG. 1 is a block diagram showing a structure of a display device to which the invention is adopted.

FIG. 1 shows a display device according to the invention. The display device comprises a display panel 1, a display controller 2, a driving line circuit 3, a scanning line circuit 4, and a clock signal generator 5. The display panel 1 is provided with a plurality of driving lines A1 to Am (m is the integer which is equal to or greater than two) and a plurality of scanning lines B1 to Bn (n is the integer which is equal to or greater than two) each disposed in parallel. The driving lines A1 to Am and the scanning lines, B1 to Bn respectively intersect with each other. Respective pixel portions $PL_{1,1}$ to $PL_{m,n}$ are disposed at the respective intersections of the driving lines A1 to Am and the scanning line B1 to Bn, thereby forming a matrix-shaped display panel.

The respective pixel portions $PL_{1,1}$ to $PL_{m,n}$ include the respective two organic EL elements (organic electroluminescence elements) $EL1_{1,1}$ to $EL1_{m,n}$ and $EL2_{1,1}$ to $EL2_{m,n}$. The respective $EL1_{1,1}$ to $EL1_{m,n}$ are connected with the respective $EL2_{1,1}$ to $EL2_{m,n}$ in parallel respectively between the driving lines A1 to Am and scanning lines B1 to Bn. In this parallel connection, the organic EL elements $EL1_{1,1}$ to $EL1_{m,n}$ and the organic EL elements $EL2_{1,1}$ to $EL2_{m,n}$ are respectively connected with each other in inverse polarity. For further detailed description of the organic EL elements $EL1_{1,1}$ and $EL2_{1,1}$, the anode of the organic EL element $EL1_{1,1}$ and the cathode of the organic EL element $EL2_{1,1}$ are connected to the driving line A1 in common and the cathode of the organic EL element $EL1_{1,1}$ and the anode of the organic EL element $EL2_{1,1}$ are connected to the scanning line B1 in common. The other organic EL elements $EL1_{1,2}$ to $EL1_{m,n}$ and $EL2_{1,2}$ to $EL2_{m,n}$ have the same connections as the organic EL elements $EL1_{1,1}$ and $EL2_{1,1}$.

In the display panel 1, the respective driving lines A1 to Am are connected to the driving line circuit 3 through capacitors Ca1 to Cam, respectively. The respective scanning lines B1 to Bn are connected to the scanning line circuit 4 through capacitors Cb1 to Cbn, respectively.

The display controller 2 is formed by a CPU so as to perform a control for displaying an image corresponding to input image data, on the display panel 1 under the line sequential scanning system. In synchronization with a predetermined scanning timing for the control, a scanning instruction is issued to the scanning line circuit 4 and simultaneously a driving instruction is issued to the driving line circuit 3. The driving instruction is data indicative of one scanning line, consisting of m×i bits. Namely, m corresponds to the number of the driving lines and a luminance level of one pixel portion is represented by i bits (for example, 4 bits). When there is a bit indicating "1" of the i bits, the pixel portion is driven to emit light, and when all of the i bits indicate "0", the pixel portion is not driven and does not emit light. The contents of the driving instruction are varied in accordance with the input image data every time of advancing a scanning line according to the scanning instruction.

The clock signal generator 5 issues two clock signals which have a relation of mutually inverse phase. The frequency of the clock signal is, for example, 1 MHZ. The clock signal of the regular phase is supplied to the driving line circuit 3 and the clock signal of the opposite phase is supplied to the scanning line circuit 4.

The driving line circuit 3 has m driving voltage generators $3_1$ to $3_m$, each of which is supplied with the clock signal of the regular phase from the clock signal generator 5 and is supplied with the i bits corresponding to the driving instruction from the display controller 2. When the corresponding i bits are all "0", the respective driving voltage generators $3_1$ to $3_m$ supply a voltage Vref(0V). When a bit indicating "1" is included in the corresponding i bits, the respective driving voltage generators $3_1$ to $3_m$ supply a drive alternating current signal with square waves in which voltages +Vp and −Vp alternatively appear, in synchronization with the clock signal of regular phase.

The scanning line circuit 4 has n scanning voltage generators $4_1$ to $4_n$, each of which is supplied with the clock signal of the opposite phase from the clock signal generator 5 and is supplied with the scanning instruction from the display controller 2. The scanning voltage generators $4_1$ to $4_n$ are specified one by one in a predetermined order in accordance with the scanning instruction in order to determine a line to be scanned from the scanning lines B1 to Bn. The scanning line corresponding to one specified scanning voltage generator is a line to be scanned at that time. The one scanning voltage generator supplies a scan alternating current signal with square waves in which the voltages +Vp and −Vp alternatively appear in synchronization with the clock signal of the opposite phase. The remaining scanning voltage generators other than the one scanning voltage generator supply the voltage Vref.

There is a relationship of mutual inverse phase between a drive alternating current signal supplied from one of the driving voltage generators $3_1$ to $3_m$ and a scan alternating current signal supplied from one of the scanning voltage generators $4_1$ to $4_n$. Namely, when the drive alternating current signal is the voltage +Vp, the voltage of the scan alternating current signal is −Vp and when the drive alternating current signal is the voltage $-Vp$, the voltage of the scan alternating current signal is $+Vp$.

The voltage Vp of the alternating current signal is lower than a light emission starting voltage Vth of each of the organic EL elements $EL1_{1,1}$ to $EL1_{m,n}$ and $EL2_{1,1}$ to $EL2_{m,n}$, and higher than Vth/2. 2Vp is a voltage higher than the voltage Vth. Namely, Vth/2<Vp<Vth.

Figure 2:
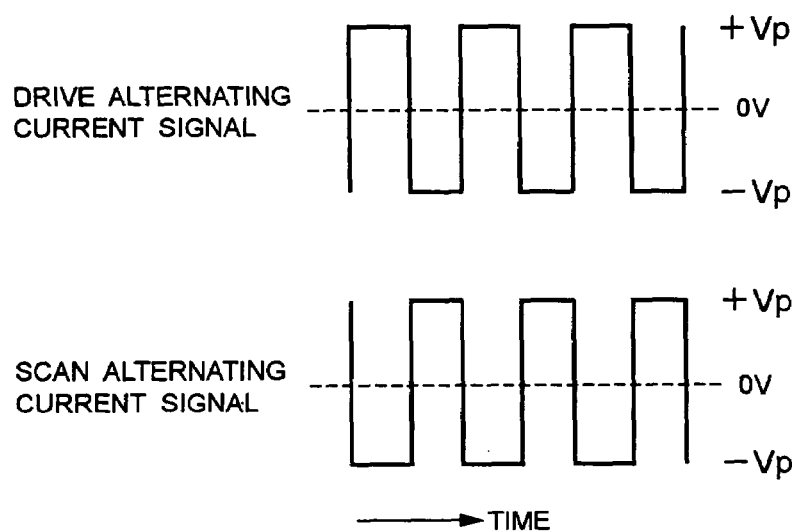
FIG. 2 is a view showing waveforms of a drive alternating current signal and a scan alternating current signal.

In the display device constituted in the above, for example, when light emission of the pixel portion $PL_{1,1}$ is specified in accordance with the input image data, the driving voltage generator $3_1$ is activated in response to the driving instruction from the display controller 2 in synchronization with the time the scanning voltage generator $4_1$ is activated in response to the scanning instruction from the display controller 2. From the driving voltage generator $3_1$, a drive alternating current signal, as shown in FIG. 2, is supplied to the driving line A1 through the capacitor Ca1 and a scan alternating current signal, as shown in FIG. 2, is supplied from the scanning voltage generator $4_1$ to the scanning line B1 through the capacitor Cb1. The drive alternating current signal and the scan alternating current signal are mutually inverted in the phase. Thus, when the drive alternating current signal is $+Vp$, the scan alternating current signal is $-Vp$. A voltage 2Vp is applied to a serial circuit including the capacitor Ca1, the EL elements $EL1_{1,1}$ and $EL2_{1,1}$, and the capacitor Cb1. The polarity on the side of the capacitor Ca1 of the serial circuit is positive and the polarity on the side of the capacitor Cb1 is negative. Since the voltage 2Vp is higher than the light emission starting voltage Vth, a current flows into the scanning voltage generator $4_1$ through the capacitor Ca1, the anode/cathode of the EL element $EL1_{1,1}$, and the capacitor Cb1, from the driving voltage generator $3_1$. Thus, the EL element $EL1_{1,1}$ emits light. By flowing the emission current for making the EL element $EL1_{1,1}$ emit light, the capacitor Ca1 and the capacitor Cb1 are charged. The electric charges of the capacitor Ca1 and the capacitor Cb1 are gradually increased. The operation is the first light emission operation in the half cycle of the clock signal.

While, when the drive alternating current signal is $-Vp$, the scan alternating current signal is $+Vp$. The voltage 2Vp is applied to the serial circuit including the capacitor Ca1, the EL elements $EL1_{1,1}$ and $EL2_{1,1}$, and the capacitor Cb1. The polarity on the side of the capacitor Ca1 of the serial circuit is negative and the polarity on the side of the capacitor Cb1 is positive. Accordingly, from the scanning voltage generator $4_1$, a current flows into the driving voltage generator $3_1$ through the capacitor Cb1, the anode/cathode of the EL element $EL2_{1,1}$, and the capacitor Ca1. Thus, the EL element $EL2_{1,1}$ emits light. By flowing the emission current for making the EL element $EL2_{1,1}$ emit light, the electric charges of the capacitor Ca1 and the capacitor Cb1 are gradually discharged and then they are charged with the inverse polarity. The electric charges of the capacitor Ca1 and the capacitor Cb1 are gradually increased. The operation is the second light emission operation in the remaining half cycle of the clock signal.

Accordingly, since the first and second light emission operations are alternatively repeated in accordance with the frequency of the clock signal, the pixel portion $PL_{1,1}$ maintains emitting light.

When the light emission of only the pixel portion $PL_{1,1}$ is specified as mentioned above, the voltage Vref of 0V is supplied from the driving power generator $3_2$ to $3_m$ during the first light emission operation. At this time, as mentioned above, a scan alternating current signal is supplied to the scanning line B1 from the scanning voltage generator $4_1$ through the capacitor Cb1. When the pixel portion $PL_{2,1}$, for example, on the scanning line B1 will be described, since the scan alternating current signal becomes $-Vp$, the voltage Vp is applied to the serial circuit including the capacitor Ca2, the EL elements $EL1_{2,1}$ and $EL2_{2,1}$, and the capacitor Cb1. The polarity on the side of the capacitor Ca2 of the serial circuit is positive and the polarity on the side of the capacitor Cb1 is negative. Since the voltage Vp is lower than the light emission starting voltage Vth, A current flows into the scanning voltage generator $4_1$ through the capacitor Ca2, the anode/cathode of the EL element $EL1_{2,1}$, and the capacitor Cb1, from the driving voltage generator $3_2$, but the EL element $EL1_{2,1}$ does not emit light. Since the current never flows into the EL element $EL2_{2,1}$, naturally it does not emit light. While, since the scan alternating current signal is $+Vp$ during the second light emission operation, the voltage Vp is applied to the serial circuit including the capacitor Ca2, the EL elements $EL1_{2,1}$ and $EL2_{2,1}$, and the capacitor Cb1. The polarity on the side of the capacitor Ca2 of the serial circuit is negative and the polarity on the side of the capacitor Cb1 is positive. Although A current flows into the driving voltage generator $3_2$ through the capacitor Cb1, the anode/cathode of the EL element $EL2_{2,1}$, and the capacitor Ca2, from the scanning voltage generator $4_1$, the EL element $EL2_{2,1}$ does not emit light. Since the current does not flow into the EL element $EL1_{2,1}$, it does not emit light. It is the same as for the pixel portions $PL_{3,1}$ to $PL_{m,1}$, for example, on the scanning line B1.

When the luminescence of only the pixel portion $PL_{1,1}$ is specified similarly, the voltage Vref of 0V is supplied from the scanning voltage generators $4_2$ to $4_n$ during the period of the first light emission operation as mentioned above. At this time, a drive alternating current signal is supplied from the driving voltage generator $3_1$ to the driving line A1 through the capacitor Ca1. When the pixel portion $PL_{1,2}$, for example, on the driving line A1 is described, since the drive alternating current signal becomes $+Vp$, the voltage Vp is applied to the serial circuit including the capacitor Ca1, the EL elements $EL1_{1,2}$ and $EL2_{1,2}$, and the capacitor Cb2. The polarity on the side of the capacitor Ca1 of the serial circuit is positive and the polarity on the side of the capacitor Cb2 is negative. Since the voltage Vp is lower than the light emission starting voltage Vth, the current flows into the scanning voltage generator $4_2$ from the driving voltage generator $3_1$ through the capacitor Ca1, the anode/cathode of the EL element $EL1_{1,2}$, and the capacitor Cb2, but the EL element $EL1_{1,2}$ does not emit light. Since the current does not flow into the EL element $EL2_{1,2}$, naturally it does not emit light. While, since the drive alternating current signal is $-Vp$ during the period of the second light emission operation, the voltage Vp is applied to the serial circuit including the capacitor Ca1, the EL elements $EL1_{1,2}$ and $EL2_{1,2}$, and the capacitor Cb2. The polarity on the side of the capacitor Ca1 of the serial circuit is negative and the polarity on the side of the capacitor Cb2 is positive. Although the current flows into the driving voltage generator $3_2$ from the scanning voltage generator $4_2$ through the capacitor Cb2, the anode/cathode of the EL element $EL2_{2,1}$, and the capacitor Ca1, the EL element $EL2_{2,1}$ does not emit light. Since the current does not flow into the EL element $EL1_{2,1}$, it does not emit light. It is the same as for the pixel portions $PL_{1,3}$ to $PL_{1,n}$, for example, on the driving line A1.

Since the voltage Vref of 0V is supplied respectively from the driving voltage generators $3_2$ to $3_m$ and the scanning voltage generators $4_2$ to $4_n$, to the pixel portions excluding the pixel portions $PL_{1,1}$ to $PL_{m,1}$ and the $PL_{1,2}$ to $PL_{1,n}$ on the display panel 1, the both ends of the respective pixel portions excluding the pixel portions $PL_{1,1}$ to $PL_{m,1}$ and the $PL_{1,2}$ to $PL_{1,n}$ have the identical potential and the EL elements therein do not emit light.

In the above embodiment, each of the driving voltage generators $3_1$ to $3_m$ generates such a drive alternating current signal that the voltage +Vp and the voltage −Vp alternatively appear, and similarly each of the scanning voltage generators $4_1$ to $4_n$ generates such a scan alternating current signal that the voltage +Vp and the voltage −Vp alternatively appear. The voltage, however, does not have to be in a symmetric relationship like +Vp and −Vp. For example, in the case of the drive alternating current signal and the scan alternating current signal such that the voltage Va and the voltage Vb alternatively appear, when Va>Vb, Va−Vb must be higher than the light emission starting voltage Vth and (Va−Vb)/2 must be lower than the light emission starting voltage Vth. The voltage Vref doesn't have to be 0V like the embodiment, but it should be the direct current voltage satisfying Va−Vref<Vth and Vref−Vb<Vth.

Figure 3:
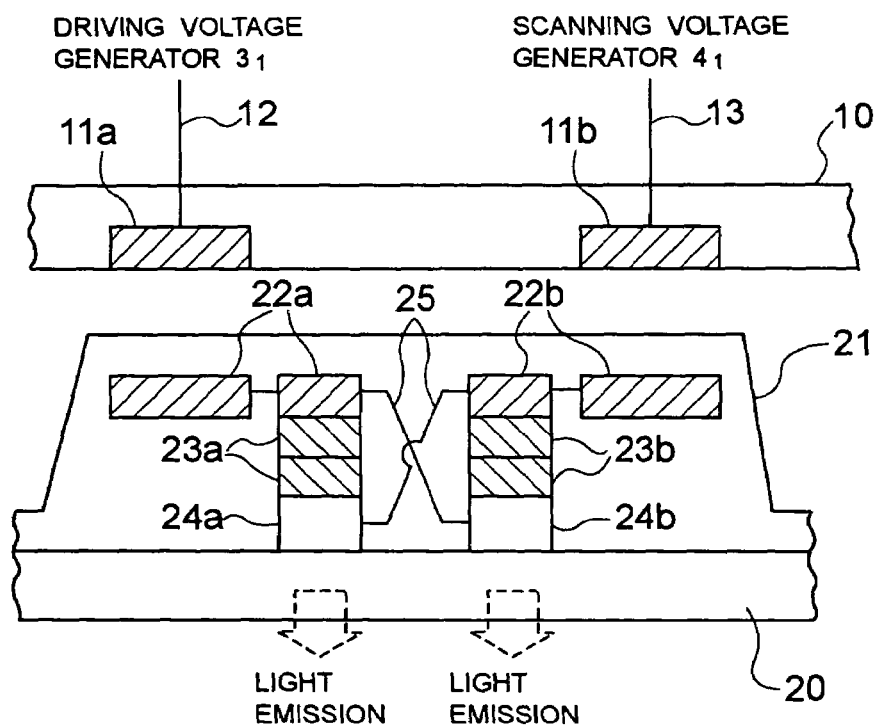
FIG. 3 is a view showing a structure of one portion of a display panel in the display device of FIG. 1.

FIG. 3 shows the structure of the portions of the pixel portion $PL_{1,1}$ and the capacitors Ca1 and Cb1 on the display panel 1 of the apparatus of FIG. 1. In FIG. 3, the pixel portion $PL_{1,1}$ and the capacitors Ca1 and Cb1 are respectively formed between a substrate 10 on the side of an inductive electrode and a transparent substrate 20 on the side of a panel. The substrate 10 on the side of the inductive electrode is, for example, an insulating substrate made from polymeric material such as plastic and two inductive electrodes 11a and 11b are embedded in the substrate 10. The inductive electrode 11a forms the capacitor Ca1 and a metallic electrode 22a described later, and it is connected to the driving voltage generator $3_1$ through a connection line 12. The inductive electrode 11b forms the capacitor Cb1 and a metallic electrode 22b described later, and it is connected to the scanning voltage generator $4_1$ through the connection line 13.

The transparent substrate 20 on the side of the panel is, for example, a transparent substrate made from polymeric (plastic) film such as polycarbonate and polyethersulfone and glass. Although the pixel portions $PL_{1,1}$ to $PL_{m,n}$ are formed on the substrate 20 on the side of the panel, FIG. 3 shows only the pixel portion $PL_{1,1}$.

The organic EL element $EL1_{1,1}$ has the structure of putting an organic function layer 23a between the transparent electrode 24a and the metallic electrode 22a. Here, the organic function layer means a single layer-structure consisting of only a luminescent layer, the two layer-structure consisting of an organic hole transport layer and a luminescent layer, or the three layer-structure consisting of an organic hole transport layer, a luminescent layer, and an organic electron transport layer, or a multilayer-structure consisting of a plurality of layers properly including an electron or a hole injection layer and a carrier block layer between these layers.

The transparent electrode 24a is an electrode having optical permeability, for example, made from the indium oxide such as Indium-Tin Oxide (ITO), working as the anode (positive) of the organic EL element $EL1_{1,1}$. While, the metallic electrode 22a is made from metal such as aluminum, working as the cathode (negative) of the organic EL element.

Being excited by the power supply from the upper and the lower electrodes, the organic function layer 23a presents the luminescent phenomenon and discharges this luminescence to the outside of the display panel after passing through the transparent electrode 24a and the transparent substrate 20.

The organic EL element $EL2_{1,1}$ includes a metallic electrode 22b, an organic function layer 23b, and a transparent electrode 24b similarly to the organic EL element $EL1_{1,1}$.

A connection line 25 connects the metallic electrode 22a and the transparent electrode 24b, and another connection line 25 connects the metallic electrode 22b and the transparent electrode 24a.

An insulation seal film 21 made from a silicon dioxide layer such as SiON and SiOx, covers the whole pairs of the organic EL elements, to seal the organic EL element pairs on the transparent substrate 20 completely in airtight. Namely, the electrodes of the organic EL elements are never drawn to the outside from the insulation seal film 21. Therefore, it becomes easy to form the insulation seal film 21 on the transparent substrate 20 on the side of the panel and the reliability of the insulation sealing processing is improved.

One or two inductive electrodes are provided only on the pixel portions $PL_{1,1}$ to $PL_{m,1}$ on the scanning line B1 and the pixel portions $PL_{1,2}$ to $PL_{1,n}$ on the driving line A1 of the display panel 1.

Figure 4:
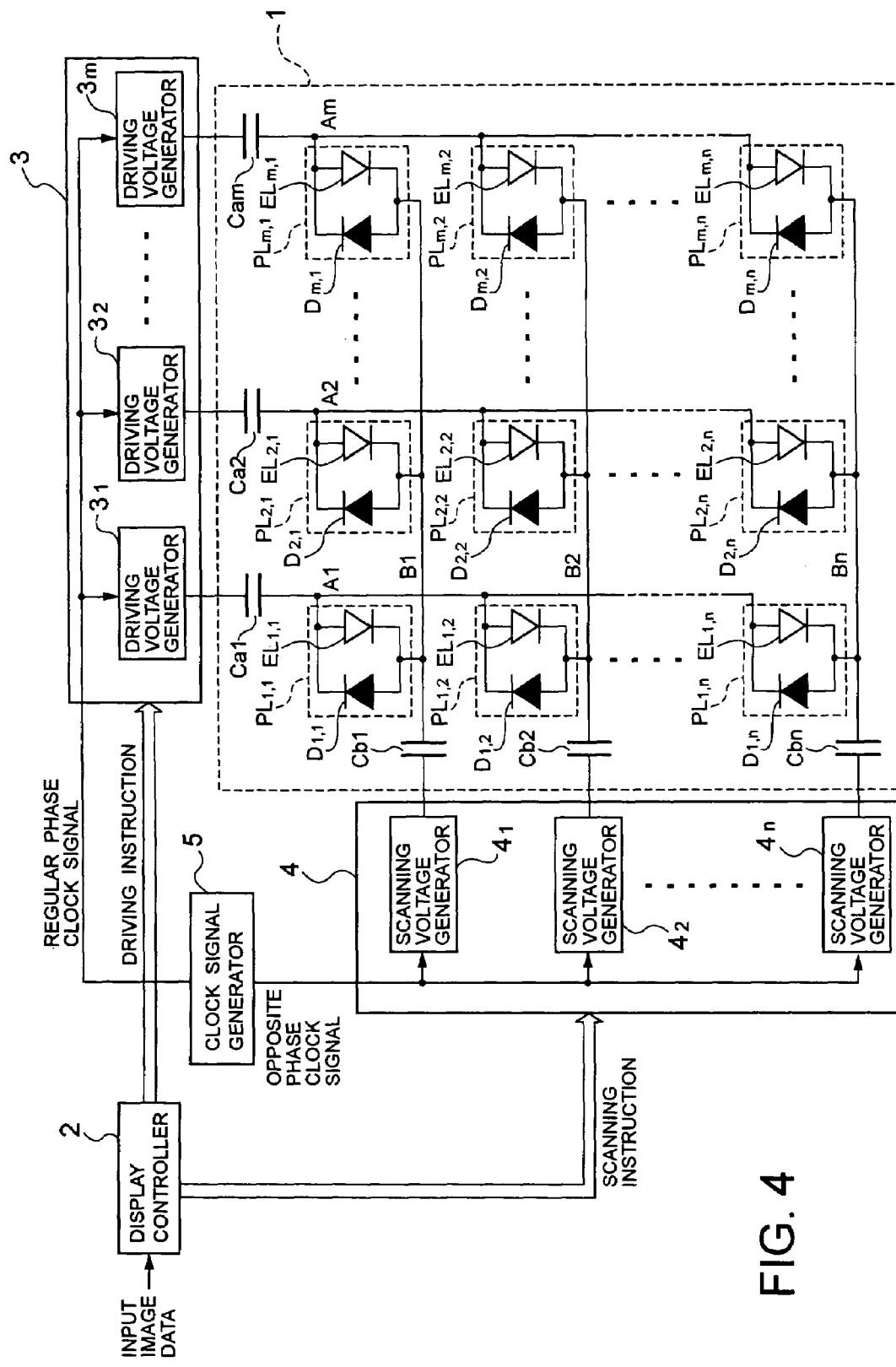
FIG. 4 is a block diagram showing a structure of a display device to which the invention is adopted.

FIG. 4 shows another embodiment of the invention. In FIG. 4, the same components as those of the display device of FIG. 1 are shown with the same reference numerals attached there. In the display device of FIG. 4, a plurality of pixel portions $PL_{1,1}$ to $PL_{m,n}$ respectively include the organic EL elements $EL_{1,1}$ to $EL_{m,n}$, and the diode elements $D_{1,1}$ to $D_{m,n}$. The structure of these pixel portion $PL_{1,1}$ to $PL_{m,n}$ is different from that of the display device of FIG. 1. The diode elements $D_{1,1}$ to $D_{m,n}$ may be the ordinary diode elements or the organic diode elements.

The organic EL elements $EL_{1,1}$ to $EL_{m,n}$ and the diode elements $D_{1,1}$ to $D_{m,n}$ are respectively connected with each other in parallel respectively between the driving lines A1 to Am and the scanning lines B1 to Bn. In the parallel connection, there is a relationship of mutually inverse polarity between the respective organic EL elements $EL_{1,1}$ to $EL_{m,n}$ and the diode elements $D_{1,1}$ to $D_{m,n}$. The organic EL elements $EL_{1,1}$ and the diode elements $D_{1,1}$ will be described specifically. The anode of the organic EL elements $EL_{1,1}$ and the cathode of the diode elements $D_{1,1}$ are connected to the driving line A1 in common and the cathode of the organic EL element $EL_{1,1}$ and the anode of the diode element $D_{1,1}$ are connected to the scanning line B1 in common. It is the same as for the other organic EL elements $EL_{1,2}$ to $EL_{m,n}$ and the diode elements $D_{1,2}$ to $D_{m,n}$.

Drive alternating current signals are supplied from the driving voltage generators $3_1$ to $3_m$ and scan alternating current signals are supplied from the scanning voltage generators $4_1$ to $4_n$, in the same way as the display device of FIG. 1. Assuming that a relationship between the voltage Vp of the alternating current signal, the light emission starting voltage Vth of the organic EL elements $EL_{1,1}$ to $EL_{m,n}$, and the forward voltage Vf at a time of turning on the diode is Vx=(Vth+Vf)/2, Vx/2<Vp<Vx.

In the display device of FIG. 4 thus constituted, for example, when light emission of the pixel portion $PL_{1,1}$ is specified in accordance with the input image data, the driving voltage generator $3_1$ is activated in response to a driving instruction from the display controller 2, in synchronization with the time when the scanning voltage generator $4_1$ is activated in response to a scanning instruction from the display controller 2. A drive alternating current signal is supplied to the driving line A1 from the driving voltage generator $3_1$ through the capacitor Ca1, and a scan alternating current signal is supplied to the scanning line B1 from the scanning voltage generator $4_1$ through the capacitor Cb1. Since the drive alternating current signal and the scan alternating current signal are mutually inverse in phase, when the drive alternating current signal is +Vp, the scan alternating current signal is −Vp. A voltage 2Vp is applied to a serial circuit including the capacitor Ca1, the EL element $EL_{1,1}$, the diode element $D_{1,1}$, and the capacitor Cb1. The polarity on the side of the capacitor Ca1 of the serial circuit is positive and the polarity on the side of the capacitor Cb1 is negative. Since the voltage 2Vp is higher than the light emission starting voltage Vth, a current flows into the scanning voltage generator $4_1$ from the driving voltage generator $3_1$ through the capacitor Ca1, the anode/cathode of the EL element $EL_{1,1}$, and the capacitor Cb1. Thus, the EL element $EL_{1,1}$ emits light. By flowing the emission current for making the EL element $EL_{1,1}$ emit light, the capacitor Ca1 and the capacitor Cb1 are charged. The electric charges of the capacitor Ca1 and the capacitor Cb1 are gradually increased. This operation is a light emission operation in half cycle of the clock signal.

While, when the drive alternating current signal is −Vp, the scan alternating current signal is +Vp. The voltage 2Vp is applied to a serial circuit including the capacitor Ca1, the EL element $EL_{1,1}$, the diode element $D_{1,1}$, and the capacitor Cb1. The polarity on the side of the capacitor Ca1 of the serial circuit is negative and the polarity on the side of the capacitor Cb1 is positive. A current flows into the driving voltage generator $3_1$ from the scanning voltage generator $4_1$ through the capacitor Cb1, the anode/cathode of the diode element $D_{1,1}$, and the capacitor Ca1. In accordance with this current, the electric charges of the capacitor Ca1 and the capacitor Cb1 are gradually discharged, and then they are charged with the inverse polarity. The electric charges of the capacitor Ca1 and the capacitor Cb1 are gradually increased. This operation is a non-light emission operation in the remaining half cycle of the clock signal.

Since the light emission operation and the non-light emission operation are alternatively repeated in accordance with the frequency of the clock signal, when the frequency of the clock signal is high, the pixel portion $PL_{1,1}$ maintains emitting light visually.

When the light emission of only the pixel portion $PL_{1,1}$ is specified, a voltage higher than the light emission starting voltage Vth is not applied to the respective EL elements of the pixel portions other than the pixel portion $PL_{1,1}$, and the EL elements of the pixel portions other than the pixel portion $PL_{1,1}$ do not emit light. The concrete description relating to this is the same as in the case of the display device of FIG. 1, and therefore the description is omitted here.

In the respective embodiments as mentioned above, the luminance of the respective pixel portions of the display panel 1 is controlled in accordance with the generating period of the drive alternating current signal in the scanning period as for one line to be scanned (scanning line). Namely, in each scanning period, the scan alternating current signal is generated for K cycles, as illustrated in FIG. 5A, while the drive alternating current signal is created for K1 cycles corresponding to the luminance level L1, from the driving voltage generator $3_1$, as illustrated in FIG. 5B, and it is generated for K2 cycles corresponding to the luminance level L2 from the driving voltage generator $3_2$, as illustrated in FIG. 5C. The luminance level is a value indicated by the i bits for one pixel portion of the driving instruction.

In the above-mentioned embodiments, although the drive alternating current signal and the scan alternating current signal are square waves, they may be sine waves or triangular waves.

In the embodiment shown in FIG. 4, the anodes of the organic EL elements $EL_{1,1}$ to $EL_{m,n}$ and the cathodes of the diode elements $D_{1,1}$ to $D_{m,n}$ may be connected to the scanning lines respectively, and the cathodes of the organic EL elements $EL_{1,1}$ to $EL_{m,n}$ and the anodes of the diode elements $D_{1,1}$ to $D_{m,n}$ may be connected to the driving lines respectively.

Further, in the respective embodiments as mentioned above, although the display panel 1 is provided with m×n pixel portions $PL_{1,1}$ to $PL_{m,n}$, even a display panel which is not provided with the whole m×n pixel portions is possible in the invention.

As described above, according to the invention, it is possible to supply power from the respective driving circuits to the organic EL elements in a simple structure. In the display panel, the number of the connection terminals with the driving circuits can be decreased, thereby decreasing the electrode occupied area.

This application is based on a Japanese Patent Application No. 2002-155694 which is hereby incorporated by reference.

What is claimed is:

1. A display device comprising:
   a display panel including m (m is an integer which is equal to or greater than two) driving lines which are disposed mutually in parallel, n (n is an integer which is equal to or greater than two) scanning lines which are disposed mutually in parallel so as to intersect with the m driving lines, a plurality of pixel portions each of which includes two organic electroluminescence elements which are connected with each other in parallel with inverse polarity, and which are connected to one of the m driving lines and one of the n scanning lines at an intersection thereof, m first capacitive elements each of which is provided so as to correspond to one of the driving lines, and has one end connected with the corresponding driving line, and n second capacitive elements each of which is provided so as to correspond to one of the scanning lines, and has one end connected with the corresponding scanning line;
   a controller which specifies one of the n scanning lines in a predetermined order and every time of specifying the one scanning line, specifies at least one pixel portion driven to emit light of the pixel portions positioned on the one scanning line;
   a driving line circuit which supplies a drive alternating current signal to the other end of the first capacitive element of which the one end is connected to the driving line corresponding to the at least one pixel portion specified by the controller; and
   a scanning line circuit which supplies a scan alternating current signal of an inverse phase to the drive alternating current signal to the other end of the second capacitive element of which the one end is connected to the one scanning line specified by the controller.

2. A display device according to claim 1, wherein an amplitude value of each of the drive alternating current signal and scan alternating current signal is lower than a light emission starting voltage when the organic electroluminescence element starts emitting light and higher than a half of the light emission starting voltage of the organic electroluminescence element.

3. A display device according to claim 1, wherein the driving line circuit applies a first predetermined voltage to the other ends of the remaining first capacitive elements other than the first capacitive element of which the other is supplied with the drive alternating current signal, during the supply of the drive alternating current signal, and the scanning line circuit applies a second predetermined voltage to the other ends of the remaining second capacitive elements other than the second capacitive element of which the other is supplied with the scan alternating current signal, during the supply of the scan alternating current signal.

4. A display device according to claim 1, wherein the controller specifies a luminance level of the one pixel portion, the scanning line circuit generates the scan alternating current signal during a period of specifying the one scanning line, and the driving line circuit generates the drive alternating signal only during a period corresponding to the luminance level specified by the controller, in the period of specifying the one scanning line.

5. A display device comprising:

a display panel including m (m is an integer which is equal to or greater than two) driving lines which are disposed mutually in parallel, n (n is an integer which is equal to or greater than two) scanning lines which are disposed mutually in parallel so as to intersect with the m driving lines, a plurality of pixel portions each of which includes an organic electroluminescence element and a diode element which are connected with each other in parallel with inverse polarity, and which are connected to one of the m driving lines and one of the n scanning lines at an intersection thereof, m first capacitive elements each of which is provided so as to correspond to one of the driving lines, and has one end connected with the corresponding driving line; and n second capacitive elements each of which is provided so as to correspond to one of the scanning lines, and has one end connected with the corresponding scanning line;

a controller which specifies one of the n scanning lines in a predetermined order and every time of specifying the one scanning line, specifies at least one pixel portion driven to emit light of the pixel portions positioned on the one scanning line;

a driving line circuit which supplies a drive alternating current signal to the other end of the first capacitive element of which the one end is connected to the driving line corresponding to the at least one pixel portion specified by the controller; and a scanning line circuit which supplies a scan alternating current signal of an inverse phase to the drive alternating current signal to the other end of the second capacitive element of which the one end is connected to the one scanning line specified by the controller.

6. A display device according to claim 5, wherein an amplitude value of each of the drive alternating current signal and scan alternating current signal is lower than a half of a total voltage of a light emission starting voltage when the organic electroluminescence element starts emitting light and a supply starting voltage when the diode element starts turning on and higher than a quarter of the total voltage.

7. A display device according to claim 5, wherein the driving line circuit applies a first predetermined voltage to the other ends of the remaining first capacitive elements other than the first capacitive element of which the other is supplied with the drive alternating current signal, during the supply of the drive alternating current signal, and the scanning line circuit applies a second predetermined voltage to the other ends of the remaining second capacitive elements other than the second capacitive element of which the other is supplied with the scan alternating current signal, during the supply of the scan alternating current signal.

8. A display device according to claim 5, wherein the controller specifies a luminance level of the one pixel portion, the scanning line circuit generates the scan alternating current signal during a period of specifying the one scanning line, and the driving line circuit generates the drive alternating signal only during a period corresponding to the luminance level specified by the controller, in the period of specifying the one scanning line.

* * * * *